US009991370B2

(12) United States Patent
Gervais et al.

(10) Patent No.: US 9,991,370 B2
(45) Date of Patent: Jun. 5, 2018

(54) METHODS AND SYSTEMS FOR ULTRA-HIGH QUALITY GATED HYBRID DEVICES AND SENSORS

(71) Applicant: THE ROYAL INSTITUTION FOR THE ADVANCMENT OF LEARNING/MCGILL UNIVERSITY, Montreal (CA)

(72) Inventors: Guillaume Gervais, Monteral (CA); Keyan Bennaceur, Sherbrooke (CA)

(73) Assignee: THE ROYAL INSTITUTION FOR THE ADVANCEMENT OF LEARNING/MCGILL UNIVERSITY, Montreal (CA)

(*) Notice: Subject to any disclaimer, the term of this patent is extended or adjusted under 35 U.S.C. 154(b) by 0 days. days.

(21) Appl. No.: 14/963,364

(22) Filed: Dec. 9, 2015

(65) Prior Publication Data

US 2016/0172479 A1    Jun. 16, 2016

Related U.S. Application Data

(60) Provisional application No. 62/091,833, filed on Dec. 15, 2014.

(51) Int. Cl.
*H01L 29/76* (2006.01)
*H01L 29/66* (2006.01)
(Continued)

(52) U.S. Cl.
CPC .... *H01L 29/7606* (2013.01); *H01L 29/66977* (2013.01); *H01L 29/1025* (2013.01);
(Continued)

(58) Field of Classification Search
CPC ... H01L 29/82; H01L 29/778; H01L 29/7727; H01L 29/205; H01L 29/1025; H01L 29/66977; H01L 29/7606
See application file for complete search history.

(56) References Cited

U.S. PATENT DOCUMENTS 5,280,181 A * 1/1994 Saito ................ H01L 29/772
257/14
5,485,018 A * 1/1996 Ogawa .............. B82Y 10/00
257/14
(Continued)

FOREIGN PATENT DOCUMENTS

JP    05145084 A * 6/1993

OTHER PUBLICATIONS

H. Van Houten et al., Quantum Point Contacts, Semiconducotrs and Semimetals, vol. 35, Chapter 2, 1992, 115 pages.*
(Continued)

*Primary Examiner* — Earl Taylor
(74) *Attorney, Agent, or Firm* — Norton Rose Fulbright Canada LLP; Alexandre Daoust (57) ABSTRACT

High electron mobility leads to better device performance and today is achieved by fabricating "gated devices" within a high-mobility two-dimensional electron gas (2DEG. However, the fabrication techniques used to form these devices lead to rapid degradation of the 2DEG quality which then can limits the mobility of the electronic devices. Accordingly, it would be beneficial to provide a process/technique which circumvents this processing and 2DEG layer damage. By exploiting a flip-chip methodology such damaging processing steps are separated to a second die/wafer which is then coupled to the 2DEG wafer. Extensions of the technique with two or more different semiconductor materials or material systems may be employed in conjunction with one or more electronic circuits to provide 2DEG enabled circuits in 2D and/or 3D stacked configurations. Further semiconductor materials providing EG elements may incorporate one or more of 2DEG, 1DEG, and "zero" DEG structures.

7 Claims, 10 Drawing Sheets

(51) Int. Cl.
    H01L 29/82    (2006.01)
    H01L 29/205   (2006.01)
    H01L 29/778   (2006.01)
    H01L 29/10    (2006.01)
    H01L 29/772   (2006.01)

(52) U.S. Cl.
    CPC .......... *H01L 29/205* (2013.01); *H01L 29/778* (2013.01); *H01L 29/7727* (2013.01); *H01L 29/82* (2013.01)

(56) References Cited

U.S. PATENT DOCUMENTS

| | | | | |
|---|---|---|---|---|
| 5,939,764 | A * | 8/1999 | Chklovskii | H01L 29/00 257/194 |
| 7,947,485 | B2 * | 5/2011 | Wu | G01N 33/48721 422/68.1 |
| 8,703,623 | B2 * | 4/2014 | Chung | H01L 21/2007 257/187 |
| 8,906,215 | B2 * | 12/2014 | Royyuru | B82Y 15/00 204/450 |
| 2004/0130037 | A1 * | 7/2004 | Mishra | H01L 21/8252 257/778 |
| 2007/0215860 | A1 * | 9/2007 | Komiyama | B82Y 10/00 257/21 |
| 2010/0270534 | A1 * | 10/2010 | Pioro-Ladriere | B82Y 10/00 257/14 |
| 2011/0018002 | A1 * | 1/2011 | Chen | H01L 21/28575 257/76 |
| 2012/0061727 | A1 * | 3/2012 | Lee | H01L 29/2003 257/183 |
| 2015/0060861 | A1 * | 3/2015 | Chiu | H01L 29/7787 257/66 |
| 2015/0279981 | A1 * | 10/2015 | Eriksson | H01L 29/7782 257/14 |
| 2016/0172479 | A1 * | 6/2016 | Gervais | H01L 29/7606 257/41 |
| 2016/0380090 | A1 * | 12/2016 | Roberts | H01L 22/32 257/76 |

OTHER PUBLICATIONS

Bennaceur, K. et al. Mechanical Flip-Chip for Ultra-High Electron Mobility Devices, Sci. Rep. 5, 13494; doi: 10.1038/srep13494, 2015, 5 pages.*

Kumar et al, "Nonconventional Odd Denominator Fractional Quantum Hall States in the Second Landau Level", Physical Review Letters, Dec. 2010, 246808, vol. 105, Issue 24, American Physical Society, USA.

Fowler et al., "Conductance in Restricted-Dimensionality Accumulation Layers", Physical Review Letters, 1982, pp. 196-199, vol. 48, Issue 3, American Physical Society, USA.

Van Wees et al., "Quantized Conductance of Point Contacts in a Two-Dimensional Electron Gas", Physical Review Letters, Feb. 29, 1988, pp. 848-850, vol. 60, No. 9, American Physical Society, USA.

Van Houten et al., "Quantum Point Contacts: The Quantization of Ballistic Electron Transport through a Constriction Demonstrates that Conduction is Transmission", Physics Today, Jul. 1996, p. 22, vol. 49, No. 7, American Institute of Physics, USA.

Craig et al, "Tunable Non-Local Spin Control in a Coupled Quantum Dot System", Science, Apr. 23, 2004, pp. 565-567, vol. 304, Issue 5670, American Association for the Advancement of Science, USA.

Ofek et al., "Role of Interactions in an Electronic Fabry-Perot Interferometer Operating in the Quantum Hall Effect Regime", Proceedings of the National Academy of Sciences, Mar. 23, 2010, pp. 5276-5281, vol. 107, No. 12, National Academy of Sciences, USA.

Feve et al, "An On-Demand Coherent Single-Electron Source", Science, May 25, 2007, pp. 1169-1172, vol. 316, Issue 5828, American Association for the Advancement of Science, USA.

Saminadayar et al., "Observation of the e/3 Fractionally Charged Laughlin Quasiparticles", Physical Review Letters, Sep. 29, 1997, pp. 2526-2529, vol. 79, American Physical Society, USA.

McClure et al., "Fabry-Perot Interferometry with Fractional Charges", Physical Review Letters, Jun. 22, 2012, 256804, vol. 108, American Physical Society, USA.

Ji et al., "An Electronic Mach-Zehnder Interferometer", Nature, Mar. 27, 2003, pp. 415-418, vol. 422, Nature Publishing Group.

Miller et al. "Fractional Quantum Hall Effect in a Quantum Point Contact at Filling Fraction ⅔", Nature Physics, Aug. 2007, pp. 561-565, vol. 3, Nature Publishing Group.

Burke et al., "Length Scaling of Bandwidth and Noise in Hot-Electron Superconducting Mixers", Applied Physical Letters, Jun. 3, 1996, pp. 3344-3346, vol. 68, No. 23, American Institute of Physics, USA.

Willett et al., "Measurement of Filling Factor 5/2 Quasiparticle Interference with Observation of Charge e/4 and e/2 Period Oscillations", Proceedings of the National Academy of Sciences, Jun. 2, 2009, pp. 8853-8858, vol. 106, No. 22, National Academy of Sciences, USA.

Reulet et al., "Dynamic Response of Isolated Aharonov-Bohm Rings Coupled to an Electromagnetic Resonator", Physical Review Letters, Jul. 3, 1995, pp. 124-127, vol. 75, No. 1, American Physical Society, USA.

* cited by examiner

METHODS AND SYSTEMS FOR ULTRA-HIGH QUALITY GATED HYBRID DEVICES AND SENSORS

CROSS-REFERENCE TO RELATED APPLICATIONS

This patent application claims the benefit of priority from U.S. Provisional Patent Application 62/091,833 filed Dec. 15, 2014 entitled "Methods and Systems for Ultra-High Quality Gated Hybrid Devices and Sensors", the entire contents of which are incorporated herein by reference.

FIELD OF THE INVENTION

The present invention relates to electron gas electronic circuit elements and more particularly to manufacturing and design methodologies for enabling electronic circuits exploiting reduced dimension electron gas structures in different semiconductor materials.

BACKGROUND OF THE INVENTION

One of the most important recent developments in semiconductors, both from the point of view of physics and for the purpose of device developments, has been the achievement of structures in which the electronic behavior is essentially two-dimensional (2D). This means that, at least for some phases of operation of the device, the carriers are confined in a potential such that their motion in one direction is restricted and thus is quantized, leaving only a two-dimensional momentum which characterizes motion in a plane normal to the confining potential. The major systems where such 2D behavior has been studied are MOS and HEMT structures, quantum wells and superlattices. More recently, quantization has been achieved in 1-dimension through the formation of quantum wires and in zero" dimensions through the use of quantum dots.

In the past 30 years there has been considerable research involving 2D electronic gases (2DEGs) and 2D hole gases (2DHGs), and much continues to this day. 2DEGs due to their presence in transistor like structures formed from semiconductors have offered researchers a mature system for providing extremely high mobility electrons, especially at low temperatures. When cooled to 4K, 2DEGs may have mobilities of the order of 1,000,000 $cm^2/Vs$ and even lower temperatures can lead to further increases in mobility. Specially grown, state of the art heterostructures with mobilities around 30,000,000 $cm^2/Vs$ have been made, see for example A. Kumar et al in "Non-Conventional Odd-Denominator Fractional Quantum Hall States in the Second Landau Level" (Phys. Rev. Lett., Vol. 105, 246808, 2010). These enormous mobilities have provided a test bed for exploring fundamental physics, such as for example the first demonstration of the integer and fractional quantum Hall effects, since besides confinement and effective mass, the electrons do not interact with the semiconductor very often. For reference mobilities in 2DHG systems are smaller than those of most 2DEG systems, in part due to larger effective masses of holes, such that a few 1,000 $cm^2/Vs$ are already considered high mobility.

Electrical conductivity is proportional to the product of mobility and carrier concentration and accordingly the same conductivity can come from a small number of electrons with high mobility for each, or a large number of electrons with a small mobility for each. For metals, it would not typically matter which of these is the case, since most metal electrical behavior depends on conductivity alone. Therefore, mobility is relatively unimportant in metal physics. On the other hand, for semiconductors, the behavior of transistors and other devices can be very different depending on whether there are many electrons with low mobility or few electrons with high mobility and accordingly, mobility is a very important parameter for semiconductor materials where almost always, higher mobility leads to better device performance, with other things equal. As within a semiconductor device the same electrical conductivity can be derived from a small device geometry with a low number of high mobility electrons and a large device geometry with a large number of low mobility electrons. Accordingly, 2DEGs allow for smaller device geometries and faster devices.

At the same time the realization of the split gate opened up the possibility to observe several new quantum effects in electron transport generating a field of research on its own. Amongst split gates is the quantum point contact (QPC), whereby a narrow constriction with a tunable width comparable to the Fermi wavelength is fabricated on a 2DEG. The QPC led to the observation of one-dimensional ballistic transport, a regime where the conductance is quantized in even steps of 2 $e^2/h$ as a function of the constriction width. QPCs have not only allowed research into ballistic quantum transport and mesoscopic physics but today very similar fabrication techniques are employed to fabricate devices for studying electronic transport in quantum dots, electron interferometers, and phase-coherent mesoscopic circuits.

Further, when the electron mobility within a 2DEG exceeds ~$10^5$ $cm^2/V \cdot s$ additional quantum effects can arise within a magnetic field, such as the Fractional Quantum Hall (FQH) effect. This counter-intuitive phenomenon involves the two-dimensional system acquiring fractional effective charges, quantum statistics and quantum numbers, all driven by electron-electron interactions. This is in stark contrast with the Integer Quantum Hall (IQH) effect whose emergence does not involve any interactions and consequently is much more robust against disorder.

Whilst detrimental to the electronic mobility of its 2DEG, split gates fabricated on high-mobility GaAs/AlGaAs heterostructures have led to important insights. For instance, shot noise measurements were used to determine effective charges in FQH circuits, electron interferometry with FQH quasiparticles is now performed in Fabry-Perot, and/or Mach-Zehnder interferometers which are electronic equivalent to those used in optics.

However, a significantly limitation is the processing required to fabricate these gates, which results in unwanted degradation of the electron mobility. This is particularly damaging for delicate many-body quantum states such as the 5/2 and 12/5 FQH states. These states are unusual in that their quantum statistics is believed to emanate from a non-Abelian lineage, but unfortunately their small energy many-body gaps of ~500 mK and ~50 mK respectively are affected by disorder of any kind. As such, it has been difficult thus far to study these states in gated structures to date except for a limited number of tour de force experiments performed on the 5/2 FQH state.

Within the prior art the approaches to fabricating a "gated device" with a high-mobility 2DEG, such as those found in MOSFETs, HEMTs, etc. exploit direct lithography, be it photolithography or e-beam lithography, directly on the high-quality wafer where the 2DEG is to be formed. However, these techniques lead to rapid degradation of the 2DEG quality during processing which then can limits the mobility of the electronic devices. Accordingly, it would be beneficial to provide a process/technique which circumvents this processing and 2DEG layer damage within the region of the wafer comprising the 2DEG layer being exploited. The inventors have established a methodology exploiting a first substrate, e.g. silicon, upon which the required lithography processing etc are performed which is then connected to a second substrate, supporting a semiconductor structure providing a 2DEG under defined operating conditions. This connection being achieved through bringing the surface of the second substrate with the 2DEG layer into contact with the surface of the first substrate supporting metallization to apply the electric field to the 2DEG layer. Advantageously this offers the advantage that no processing at all is performed on the 2DEG wafer, offering possibilities for much higher-quality high-mobility devices. Furthermore, the same sets of "gates", or same device, can sequentially be used on distinct high-mobility wafers. Accordingly, rather than throwing away expensive high-quality wafers, the design methodology of the inventors requires patterning of lower cost wafers, such as silicon, which are also easier to control in terms of manufacturing by exploiting standard high volume semiconductor manufacturing techniques. For example, the technique can be used to provide a low-noise high-frequency pre-amplifier HEMT, which is found in essentially every portable electronic device supporting wireless communications without requiring a discrete amplifier die in conjunction with a silicon integrated circuit.

To the best knowledge of the inventors there has been no technique reported within the prior art fabricating gated electronic devices entirely free of lithography and processing on a two-dimensional electron gas (2DEG) wafer. The technique of the inventors allows silicon substrates, silicon CMOS electronics, and other associated low cost high volume manufacturing rather than custom-grown molecular beam epitaxy (MBE) material that is extremely expensive to grow. Beneficially, the technique also allows for device designs and geometries to be tested on a distinct 2DEG wafer since the devices can be removed from the 2DEG wafer, and replaced with another one. Conversely, several 2DEG materials with different specifications can be tested on a given device design and geometry allowing for rapid prototyping and development. Beneficially the technique is fully compatible with modern high volume foundries. Potentially the technique also allows for low cost integration methodologies for 1D and "zero" D electron gas structures.

According to extensions of the technique two or more different semiconductor materials or material systems may be employed in conjunction with one or more electronic circuits to provide 2DEG enabled circuits in 2D and/or 3D stacked configurations. Further semiconductor materials providing EG elements may incorporate one or more of 2DEG, 1DEG, and "zero" DEG structures.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art and provide electron gas electronic circuit elements based upon manufacturing and design methodologies for enabling electronic circuits exploiting reduced dimension electron gas structures in different semiconductor materials.

In accordance with an embodiment of the invention there is provided a method comprising:
providing a first substrate comprising at least metallization of a predetermined configuration on a first surface of the first substrate;
providing a second substrate comprising a semiconductor structures deposited upon a carrier comprising a plurality of vertically stacked semiconductor layers, wherein a predetermined portion of the semiconductor structure supports an electron gas under application of a predetermined electric field to the predetermined portion of the semiconductor structure; and
bringing the first substrate and second substrate together such that the first surface of the first substrate and the semiconductor structure are in physical contact.

In accordance with an embodiment of the invention there is provided a device comprising
a first substrate comprising at least metallization of a predetermined configuration on a first surface of the first substrate;
a second substrate comprising a semiconductor structures deposited upon a carrier comprising a plurality of vertically stacked semiconductor layers, wherein a predetermined portion of the semiconductor structure supports an electron gas under application of a predetermined electric field to the predetermined portion of the semiconductor structure; wherein
the first substrate and second substrate have been brought together such that the first surface of the first substrate and the semiconductor structure are in physical contact.

In accordance with an embodiment of the invention there is provided a method comprising bringing a first substrate and a second substrate together to form a hybrid gated electronic device, wherein a first predetermined portion of the hybrid gated electronic device is within the first substrate and a second predetermined portion of the hybrid gated electronic device is within the second substrate and comprises an electron gas.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention relates to electron gas electronic circuit elements and more particularly to manufacturing and design methodologies for enabling electronic circuits exploiting reduced dimension electron gas structures in different semiconductor materials.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Amongst the useful and versatile structures for electronics is the metal-insulator-semiconductor (MIS) layered structures, the most important of these being the metal-oxide-semiconductor (MOS) structures. For a gate voltage $V_G=0$ (the flat-band case) there are (ideally) no charge layers, and the energy levels of the metal (M) and semiconducting (S) regions line up to yield the same Fermi level. Considering the base region to be doped p-type then for a negative gate voltage, $V_G<0$ and electric field is set up in the oxide causing the Si bands to bend up at the oxide interface so that the Fermi level is closer to the valence-band edge. Thus extra holes accumulate at the semiconductor-oxide interface and electrons accumulate at the metal-oxide interface. With the gate voltage positive, $V_G>0$, but less than some threshold voltage, $V_T$, which is defined as the gate voltage where the intrinsic Fermi level and the actual Fermi level are coincident at the interface then the Si bands bend down at the interface resulting in a depletion of holes, and a negatively charged layer of localized states is formed at the semiconductor-oxide interface. The size of this "depletion region" increases as $V_G$ increases. The corresponding positively charged region at the metal-oxide interface is also shown. Finally, for $V_G>V_T$ the intrinsic Fermi level at the interface drops below the actual Fermi level, forming the "inversion layer", where mobile electrons reside.

Accordingly, the electric field induced from the gate voltage dramatically changes the conducting properties of the carriers beneath the gate. Use of this effect is exploited within a metal-oxide-semiconductor field-effect transistor (MOSFET). However, it is the electrons in this inversion layer which are of interest, both because they can be confined so as to exhibit two-dimensional behavior, and because they can be controlled by the gate voltage in the MOSFET. Accordingly, a two-dimensional electron gas (2DEG) is formed at the interface between the oxide and the p-type silicon substrate.

Other systems where two-dimensional behavior has been observed include heterojunctions of III-V compounds such as GaAs/Ga$_{1-x}$Al$_x$As, layer compounds such as GaSe, GaSe$_2$ and related III-VI compounds, graphite and intercalated graphite. For example, within a GaAs High-Electron Mobility Transistor (HEMT) exploiting a modulation doped GaAs/Ga$_{1-x}$Al$_x$As on a GaAs substrate, yielding high electron mobility and high sheet density, wherein the 2DEG is formed in the undoped GaAs at the interface to the p-type doped AlGaAs. GaAs/Ga$_{1-x}$Al$_x$As heterojunctions are particularly important for device applications because the lattice constants and the coefficients of expansion of both GaAs and GaAs/Ga$_{1-x}$Al$_x$As are very similar. This lattice matching permits the growth of high mobility thin films of Ga$_{1-x}$Al$_x$As on a GaAs substrate with low defect density, low stress, and low temperature dependence.

The principles of lithography, either by exposing light or an electron beam, are well-known and well-established. Using these techniques, in particular optically-corrected photolithography, the semiconductor electronics industry has progressed to the point today where it can provide microprocessors with millions of transistors operating at gigahertz (GHz) speeds exploiting transistors with dimensions of the order of ~30 nm on a conventional silicon-based complementary metal-oxide-semiconductor (CMOS) platform. Further, these devices are available in high volume at cost points compatible with consumer electronics such as laptop computers and personal computers. Conversely, during the same period there has been substantial research and large growth within the semiconductor industry of manufacturing techniques, semiconductor material growth, etc for the production of electronic devices not based on silicon. This is, in large part because other semiconductor materials, such as GaAs and InAs, for example, have intrinsic materials properties that can provide devices with strong advantages over the more conventional silicon-based device technologies. For example, High-Electron Mobility Transistor (HEMT) device structures fabricated using GaAs/GaAlAs modulation-doped semiconductor wafers and conventional optical lithography very similar to that used for silicon-based technologies provide, as a result of the 2DEG within the undoped GaAs at the interface to the p-type doped AlGaAs higher mobility and accordingly higher operating frequencies allowing them to be used in fabricating front end high-frequency amplifiers for wireless consumer electronics for example as well as application in communications and radar systems.

Figure 1:
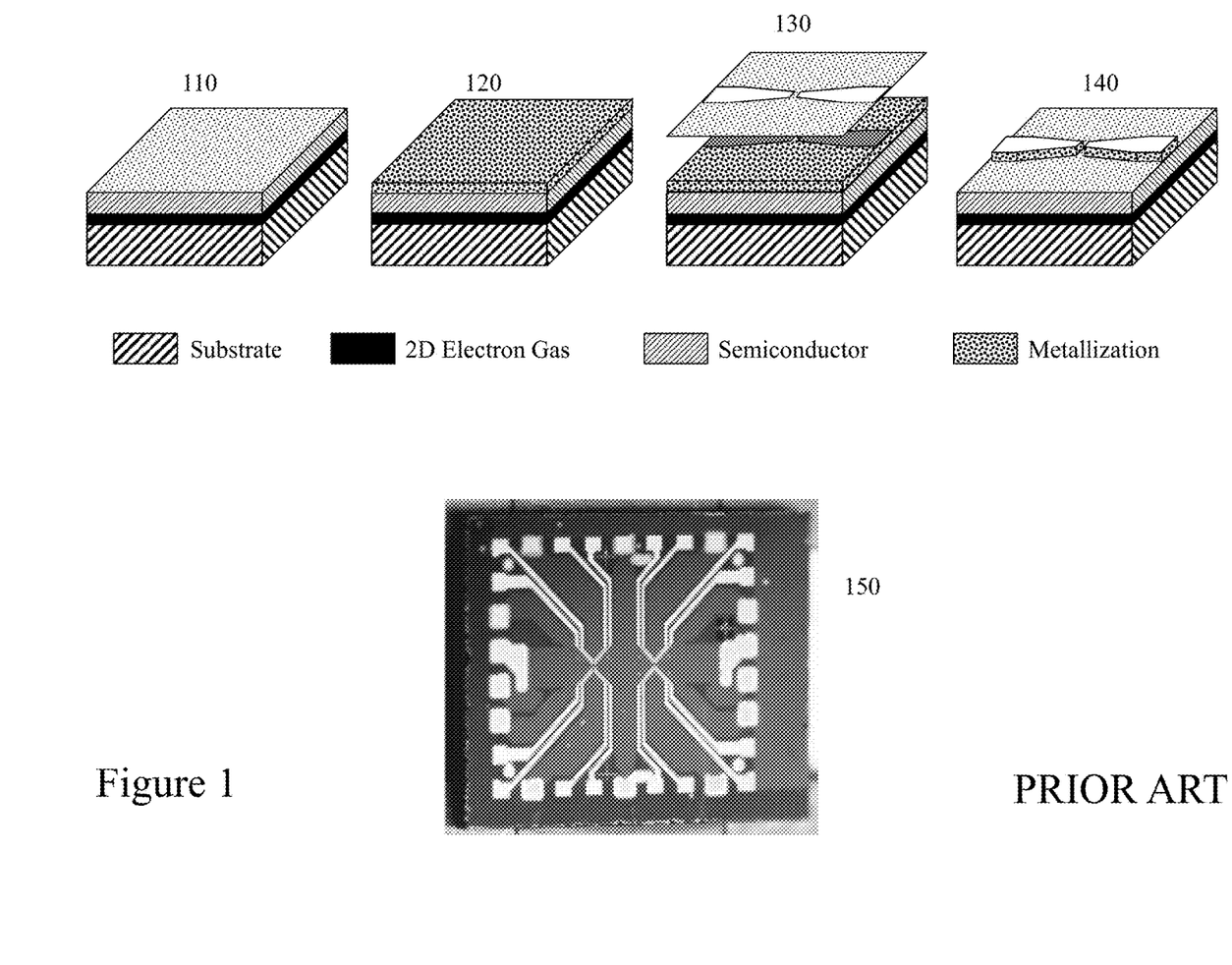
FIG. 1 depicts an exemplary process flow for a 2DEG based electronic device according to the prior art.

Referring to FIG. 1 there is depicted a schematic of an exemplary process flow for fabricating a HEMT, MOSFET, FET or other electronic device designs according to the prior manufacturing art to provide gated devices exploiting 2DEG layers buried inside a semiconductor material. Accordingly, in step 110 a semiconductor wafer comprising a substrate and semiconductor structure comprising a plurality of layers is fabricated. Subsequently, in step 120 a metallization layer is deposited atop the semiconductor structure which is then patterned with photoresist or other material using a photolithography process in step 130. The metallization layer is then etched in step 140 to yield the required electrode structure atop the semiconductor structure such that the electrode structure and semiconductor structure combine to provide the 2DEG based electronic device. An optical micrograph of a fabricated device is depicted in image 150. It would be evident to one skilled in the art that alternate manufacturing methodologies may be employed without departing from the scope of the invention such as for example using lift-off rather than etching.

Whilst this manufacturing methodology is essentially simple as it overlaps to conventional semiconductor manufacturing methodology the approach has the drawback that the drawback that the 2DEG material must be exposed to chemicals and lithographic treatment during the device fabrication. As the 2DEG layer may be only nanometers to hundreds of nanometers deep from the surface this leads to two major negative outcomes. First, as is well-known in the GaAs semiconductor community, processing tends to lower the mobility of the 2DEG and so as a result lower the performance of the device. Secondly, this approach is single shot and non-reversible in that should there be a problem or a fault during the lithographic process, the expensive semiconductor material is lost, and must be thrown away.

Accordingly, the inventors have established a new method wherein a 2DEG gated device can be fabricated without processing of the device onto the 2DEG materials directly. Rather, according to embodiments of the invention patterning is performed using conventional cheap silicon so that this is exposed to the chemical processing and photolithographic processing. The gated 2DEG device is then formed by bringing into contact the silicon to the high-quality, expensive to grow, 2DEG material. Accordingly, embodiments of the invention therefore overcome both major drawbacks of the prior art manufacturing methodology. Accordingly, the pristine 2DEG material from the growth reactor remains pristine, and it is the low cost high volume silicon which is disposed of when faulty, not the expensive 2DEG semiconductor material. Optionally in other embodiments of the invention the process due to the materials present result in effects such as the van der Waals effect bonding the elements together.

Figure 2:
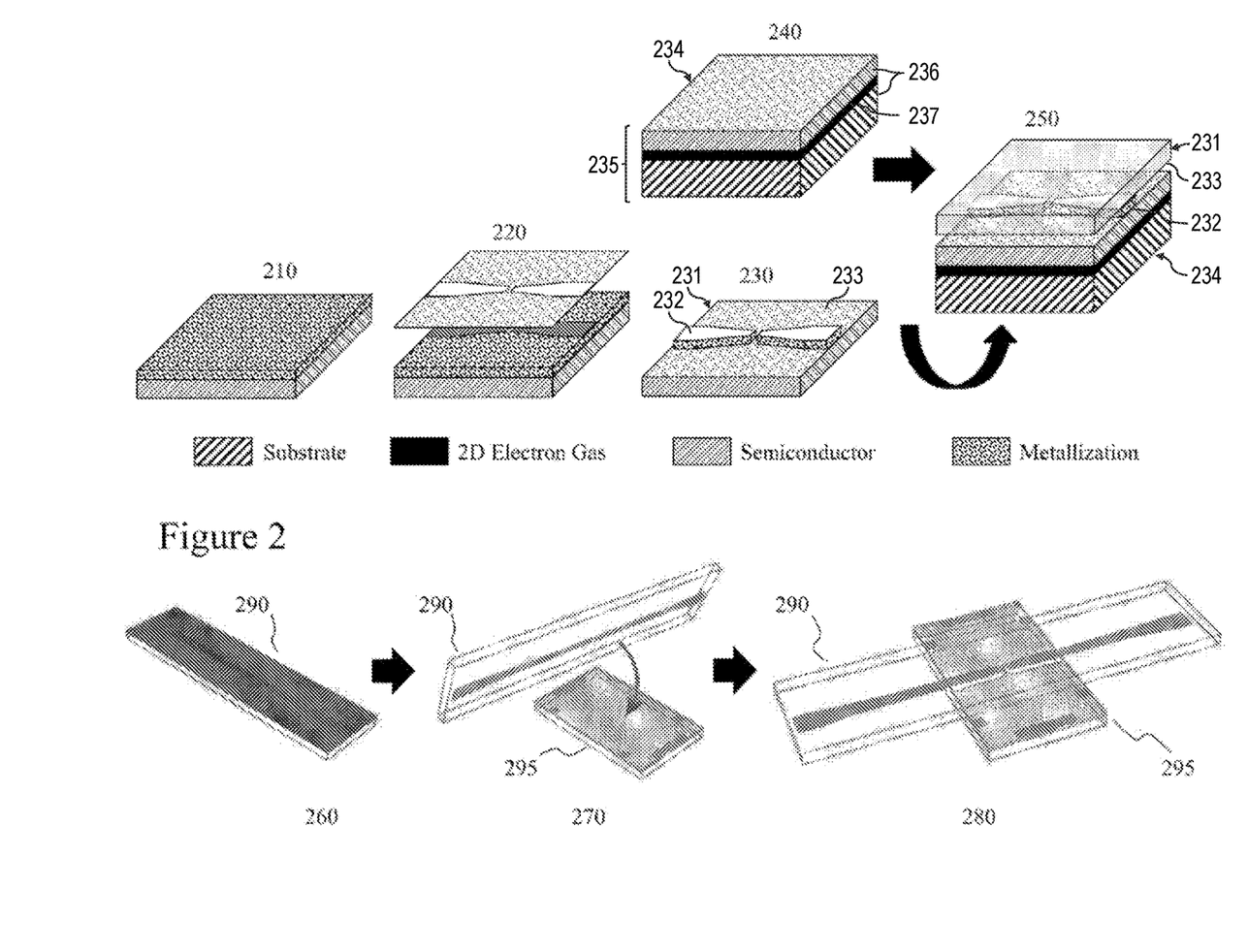
FIG. 2 depicts an exemplary process flow for a 2DEG based electronic device according to an embodiment of the invention.

Such a process is depicted in FIG. 2 wherein in steps 210 through 230 a first substrate 231 has metallization deposited, patterned, and etch for form the desired electrical structure. In this example, the first substrate 231 has metallization 232 of a predetermined configuration on a first surface 233 of the first substrate 231. The first substrate 231 is a silicon substrate in this example. Accordingly, the first substrate 231 is referred to as the silicon substrate 231 in the following. Optionally, the silicon substrate 231 may incorporate silicon electronic circuits, e.g. CMOS circuits, together with the electrical structure. In a separate process a second substrate 2342 is fabricated in step 240. The second substrate 234 has a semiconductor structure 235 deposited upon a carrier comprising a plurality of vertically stacked semiconductor layers 236, where a predetermined portion of the semiconductor structure 235 supports an electron gas 237 under application of a predetermined electric field to the predetermined portion of the semiconductor structure 235. The second substrate 234 is a 2DEG semiconductor wafer in this example. Accordingly, the second substrate 234 is referred to as the 2DEG semiconductor wafer 234 in the following. As shown, the 2DEG semiconductor wafer 234 is then brought together with the silicon substrate 231 such that the metallization 232 of the predetermined configuration of the first surface 233 of the silicon substrate 231 is in physical contact with the 2DEG semiconductor substrate 234. One or other of the two elements being flipped to mount to the other in step 250. Referring to steps 260 to 280 in FIG. 2, a pair of metallic contacts on a sapphire substrate 290 are depicted, which is flipped and brought into contact with a semiconductor substrate and 2DEG semiconductor structure 295, e.g. GaAs—AlGaAs, with Ohmic contacts to form a quantum point contact (QPC) according to an embodiment of the invention.

Optionally, the 2DEG wafer may have been processed with a low impact process to form pads of a predetermined material, e.g. gold, copper, aluminum etc. that align with patterned materials on the silicon substrate, or other suitable substrate such that if the process is carried out at elevated temperature and/or pressure the two elements are physically bonded. Materials patterned to the silicon substrate for lower temperature bonding may include, for example, indium-silver ($In_XAg_{1-X}$), tin-silver-copper ($Sn_XAg_YCu_{1-(X+Y)}$) and tin-silver ($Sn_XAg_{1-X}$).

Figure 3:
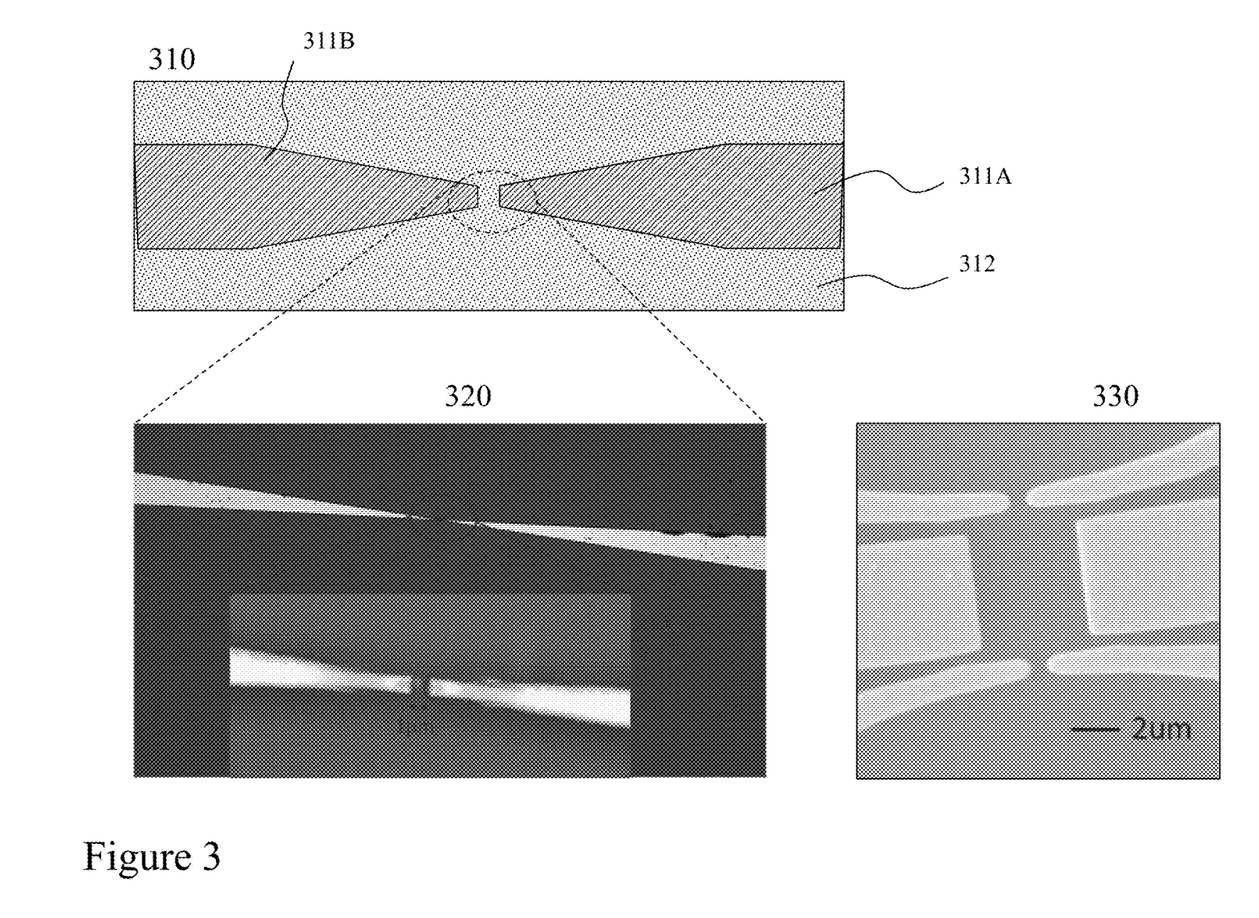
FIG. 3 depicts a schematic and optical micrograph of a quantum point contact (QPC) formed upon a silicon substrate for use in conjunction with a 2DEG wafer according to an embodiment of the invention.

Referring to FIG. 3 there is depicted a schematic 310 of the electrical circuit for a prototype consisting of a 2DEG gated quantum point contact (QPC). This comprises first and second electrodes 311A and 311B respectively upon a silicon substrate 312. As evident in first optical micrograph 320 the first and second electrodes 311A and 311B have a gap between them in this instance of 1 μm. It would be evident that the electrode gap may be formed over a wide range using optical or electron beam lithography techniques from the order of nanometers to microns or more. Also depicted in second optical micrograph 350 is an alternate test pattern wherein a pair of 2DEG gated QPCs are depicted with an isolating electrode between.

Beneficially, the embodiments of the invention circumvent the issues arising from degradation of the electronic mobility as the processing steps required to fabricate the electrostatic gates are performed on a separate substrate that is then mounted on the surface of the 2DEG substrate. This technique offers several advantages:

It avoids contamination by chemicals during the fabrication process. Usually, the gate fabrication process uses several steps in which polymer resists are deposited on the surface of the 2DEG and chemicals are used to develop and remove these resists. Even when an appropriate solvent is used, these resist residues are hard to remove and doing so often involves a cleaning process that can damage the 2DEG (e.g. an oxygen plasma). Resist residues can also trap charges and generate undesirable fluctuations in the density of the 2DEG.

It avoids degradation of the electron mobility daring lithography. Radiation damage can arise from heating, electrostatic charging, ionization damages (radiolysis), displacement damage, sputtering and hydrocarbon contamination. In our approach, the 2DEG is never exposed to any electron beam or optical lithography.

It avoids additional strain induced by differential thermal contractions. At room temperature, a 2DEG substrate such as GaAs has a thermal expansion coefficient of $\alpha_L=5.8\times10^6 K^{-1}$. Electrostatic gates are typically made with a few nanometers of titanium (TI, $\alpha_L=8.6\times10^{-6} K^{-1}$) and/or chromium (Cr, $\alpha_L=4.9\times10^{-6} K^{-1}$) adhesion layer, and most often with tens of nanometers of gold (Au, $\alpha_L=14\times10^{-6}K^{-1}$) or aluminium (Al, $\alpha_L=23.1\times10^{-6} K^{-1}$). These coefficients do not vary much from ~300K (down to ~150K) and eventually become negligible at low temperatures. For a typical 2 mm wide gate made out of Au, the gate will shrink by approximately 4 μm when cooled during the first 150K whereas GaAs will shrink by less than 2 μm. This is likely to induce strain in the material and to affect the electron mobility at low temperatures, particularly in the case of a narrow constriction with a width of only 500 nm or so.

It makes it possible to re-use the 2DEG material. The technique is non-destructive and enables the re-use of the 2DEG material at will. In addition, for the highest mobility GaAs/AlGaAs 2DEGs with mobility in excess of $30 \times 10^6$ cm$^2$/V·s, it is known that different parts of the wafer may have different mobilities as well as fluctuations in the electron density. Since several types of gated devices have active areas of only a few µm$^2$, should the need arise, the approach of the inventors allows for the device to easily be remounted on a slightly different part of the wafer. This technique also allows one to swap gates so as to measure different devices (or designs) on the exact same piece of material. Finally, it avoids wasting precious material during low-yield processes, which is common when fabricating complex devices.

Figure 4:
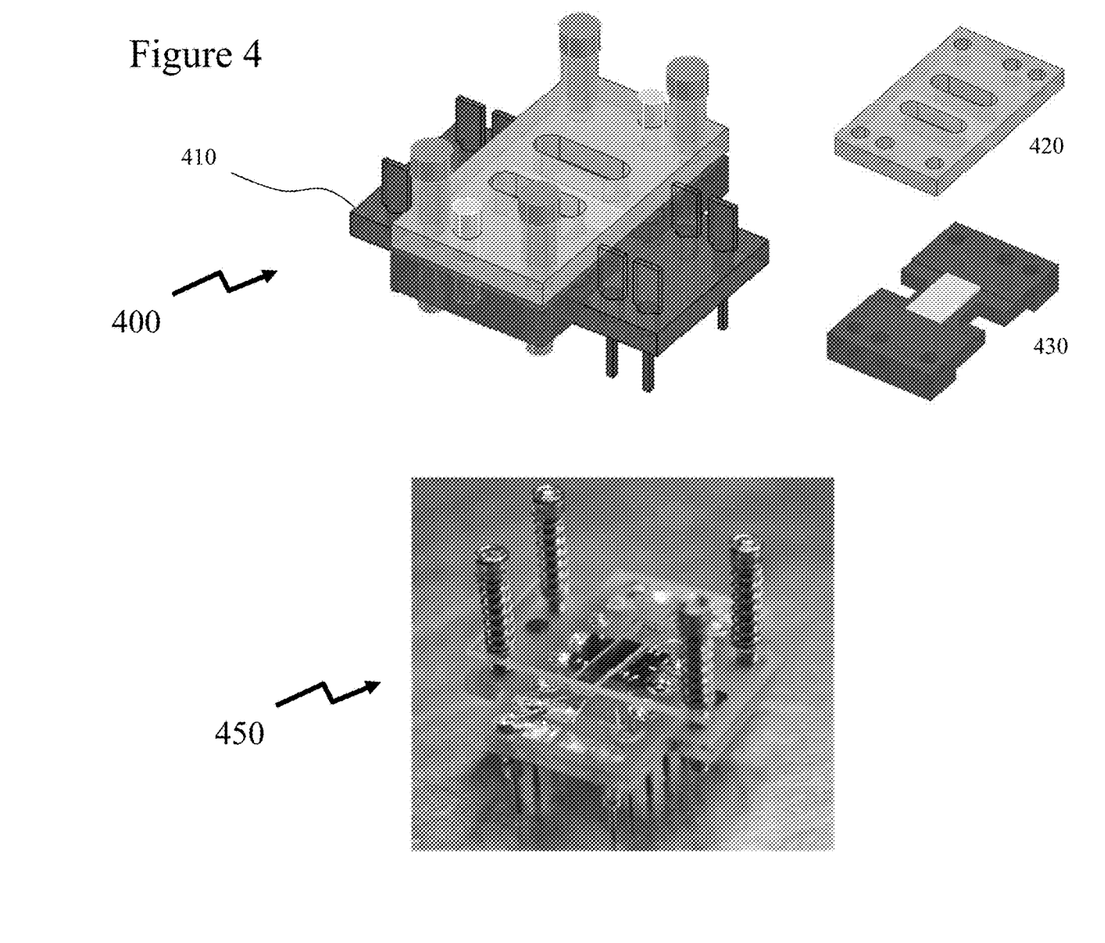
FIG. 4 depicts a test fixture for use in assembling a device exploiting an un-patterned 2DEG wafer and a patterned silicon wafer according to an embodiment of the invention.

Now referring to FIG. 4 there is depicted an exemplary test fixture 400 according to an embodiment of the invention exploited by the inventors for fabricating the prototype 2DEG SPC device. As depicted a base 430 and upper 420 are assembled onto a carrier 410 for positioning within the electrical test system to characterize the assembled devices. An assembled test fixture 400 being depicted in optical micrograph 450.

The test fixture 400 was designed to allow proof of principle device testing by allowing assembly and holding of the assembly mechanically, i.e. press the gates patterned on the silicon onto the GaAs/AlGaAs 2DEG die surface. This assembly could have been achieved by other techniques, such as wafer bonding or epitaxial lift-off for example, however for the purpose of this proof-of-concept this solution was simple. In the sample holder, two G10 plates were designed as a clamp and were placed on a conventional 16 pin sample holder where eight pins were removed for space. The 2DEG wafer is located on the first G10 plate, base 430, then the flip chip is put upside down on top of the 2DEG. The second G10 plate, upper 420, is placed on top to cover using dowel pins in order to align with the first plate. Four screws with springs are used to put a gentle pressure on the second plate 420.

Using the test fixture, the inventors have compared a device fabricated with the technique according to an embodiment of the invention with a similar device fabricated using the prior art approach. The different devices overall performance was evaluated at low temperature using the QPC depicted in FIG. 3 with an electrode gap of approximately 1 µm, although other gap widths may be employed according to the design requirements of the EG device being implemented. In the prior art gated device, these gates are patterned directly on the surface of the semiconductor, for example GaAs/AlGaAs although other materials can be used, above the 2DEG which is buried typically 100 nm to 200 nm from the surface. When a suitable negative voltage is applied to these gates, the electrons in the 2DEG underneath are depleted such that with a sufficiently high voltage it allows the flow of electrons within in the QPC to be pinched off completely leading to a zero conductance.

Embodiment 1

The wafer employed in the proof of principle experiment was a conventional 2DEG material comprising a heterostructure made out of two semiconductors with different band gap. In this instance, these were AlGaAs and GaAs grown by molecular beam epitaxy (MBE). In such material, a 2DEG is trapped at the interface between the two semiconductors approximately 100 nm underneath the surface. This material combination was chosen as this material system is commonly considered to be the "gold standard" for the fabrication of gated devices, however, the techniques according to embodiments of the invention will work with any 2DEG material system. In order to measure the conductance of the 2DEG across the QPC, ohmic contacts were fabricated and whilst there are several means to form ohmic contacts within the prior art, so which can involve lithography, and others not. In the proof of principle devices UV photolithography was employed to fabricate ten contacts in a Hall bar geometry upon the silicon substrate. The contact metallization being a standard germanium, gold and nickel system with annealing.

The QPC, i.e. the set of gates defining the device, was fabricated on a silicon wafer using convention UV photolithography and aluminium evaporation. Aluminium was selected from a perspective of hardness and cost for the initial trials but due to the formation of a protective oxide may not be suitable in production process flows and design methodologies. Accordingly, it would be evident to one skilled in the art that other electrode metallizations may be employed such as gold for example which is also low hardness. The silicon wafer was a conventional highly doped silicon wafer with 300 nm oxide on top. In general, the flatness of the oxide is better than 1 nm, so there were no issues with the uniformity of the gate profile. Conversely, the 2DEG wafer is close to atomically flat, however to ensure a better contact, the thickness of aluminum deposited was chosen to be relatively large, ~600 nm. Since the aluminium is soft, it allows good contact to be achieved when pressed mechanically against the 2DEG.

The assembly of the prototype device, Si and GaAs/AlGaAs was performed in a cleanroom after a cleaning procedure by immersion in acetone and isopropanol. This step was followed by a plasma oxygen cleaning process for the removal of organic impurities. This cleaning step was deemed necessary to have low residues on both surfaces. The 2DEG material and the Si wafer were then carefully assembled, in the cleanroom. To achieve this the 2DEG was placed on the sample holder then the Si wafer with the QPC upside down was positioned on top of the 2DEG. After that, the second G10 plate was positioned and gentle pressure applied via the four springs.

Figure 5:
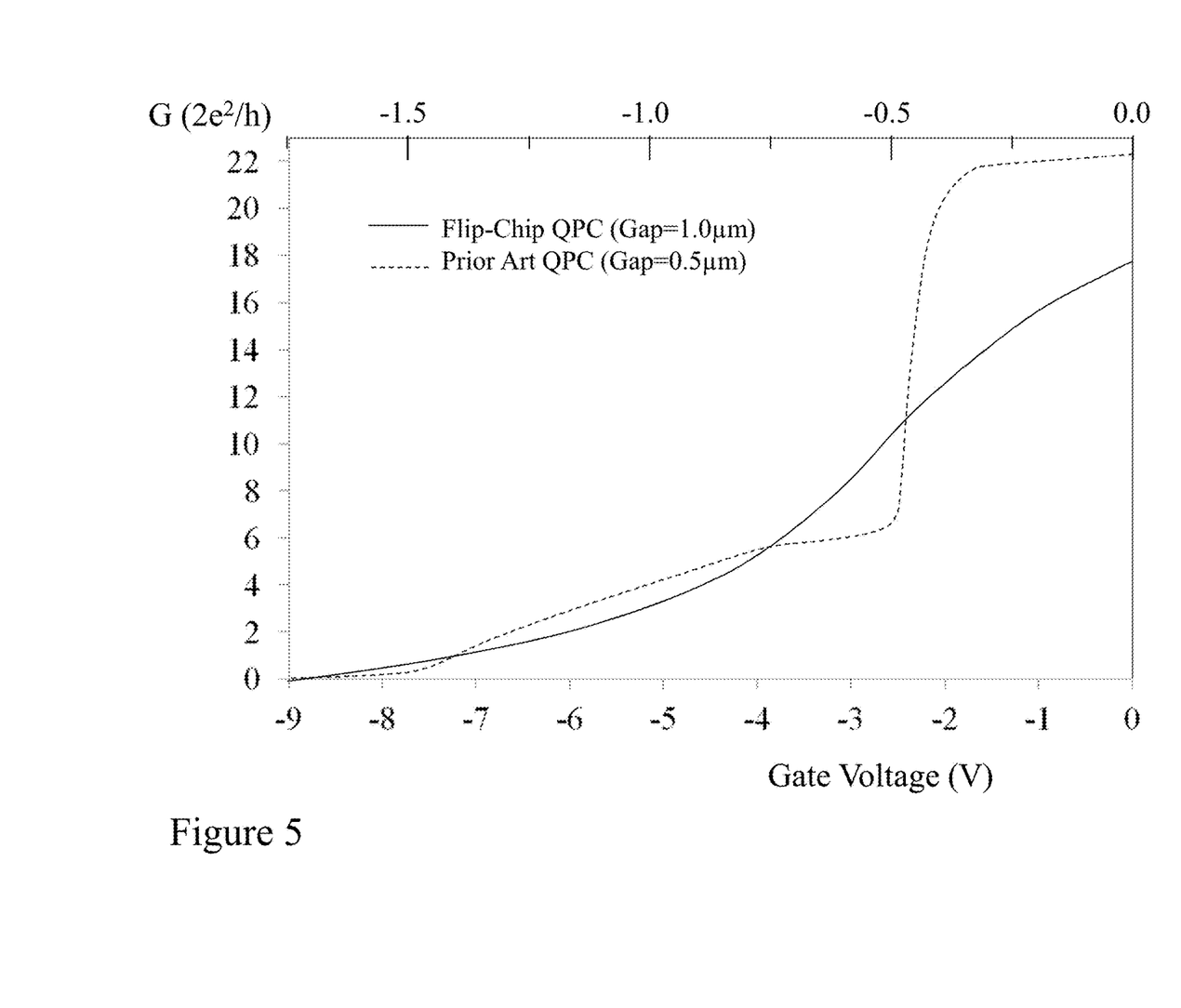
FIG. 5 depicts the measured electrical performance for a prior art monolithic quantum point contact structure and a quantum point contact structure fabricated according to an embodiment of the invention.

The conductance of the devices was measured at low temperature in a 3He cryostat (T~0.5K) using a conventional quasi-DC technique, with a small excitation voltage, as function of the gate voltage applied on the QPC. FIG. 5 depicts the results for the inventive device (solid trace) with Gap=1 µm and conventional device (dashed curve) with Gap=0.5 µm. For the p-chip device according to an embodiment of the invention a clear pinch-off, i.e. conductance going to zero, is observed at $V_{PINCH}$~–9V which is a typical feature of a QPC. This establishes unambiguously that the concept works. The conventional device as indicated above had a gap half that of the inventive device which results in a lower pinch-off voltage. Accordingly, with equivalent gaps it is anticipated that the inventive device performance will be comparable to that of the conventional device. However, it is anticipated that some variations and optimizations in tooling for the fixture, assembly processes, metallization etc may be required to reduce the pinch-off voltage to the design value and/or improve reproducibility of device characteristics.

Embodiment 2

The flip-chip technique according to an embodiment of the invention was also performed using a sapphire plate wherein all the processing was performed through a conventional electron beam (e-beam) lithography process, with 50 nm of chromium being deposited first to allow charge evacuation during the e-beam exposure followed by MMA/PMMA resist spinning. After exposure and development, 5 nm/150 nm Ti/Au is deposited by e-beam evaporation followed by lift-off and chromium etching. Particular care was taken to obtain high quality lift-of so as to prevent residual metal standing up along the edge, which could cause gate leakage or introducing an undesirable buffer space between the flip-chip gates and the 2DEG. A layer of aluminum oxide (30-100 nm thick) was then deposited to further prevent potential gate leakage. Ohmic contacts are fabricated directly on the GaAs/AlGaAs either by indium diffusion, or by evaporation of Ge/Au/Ni/Au using shadow masking to avoid lithography. The 2DEG wafer is placed on a sample holder and the Ohmic contacts are connected to the contacts of the holder by indium-soldered gold wires.

Then, the flip-chip was placed on top of the 2DEG substrate together with an additional sapphire top plate, which is itself held in place by four beryllium-copper (BeCu) springs that apply very gentle mechanical pressure. Optical interference fringes between the top plate and the flip-chip allow a fine tuning in the alignment of the flip-chip device. All fabrication and assembly steps were performed in a class 100 cleanroom to avoid contamination of the critical interfacing surfaces.

The inventors fabricated both 1 µm long QPC and Fabry-Perot gates on sapphire and tested the technique on GaAs/AlGaAs wafers grown at Sandia National Laboratories (Sample A) as well as Princeton University (Sample B). To compare performance of the flip-chip devices according to embodiments of the invention with the best prior art QPC the inventors compare the best device in each case out of 20 fabricated. In many instances, the conductance quantization was not as good as for the flip-chip devices. For the flip-chips mounted on Sample A, several QPCs showed pinch-off with a success rate of approximately 80%. In total, more than 20 devices were tested and pinch-off voltages ranging from ~6V to ~40V determined. For comparison, conventional QPCs (CQPCs) made on a similar wafer to Sample A yielded pinch-off voltages ranging from −1.7V to −3V, and thus had a superior gate efficiency by a factor ranging from ~3 to 13. The inventors attribute the lower gate efficiency of the flip-chip QPC (FCQPC) to the "air" (vacuum) gap between the flip-chip substrate and the 2DEG. A rough calculation that assumes a pinch-off voltage scaling linearly with the distance between gates and the 2DEGs estimates this gap to be in the range from 50 nm to 200 nm. This gap most likely occurs because the contact area between the 2DEG and the flip-chip gates is over 3.6×2.0 mm$^2$ in area and not perfectly flat. Accordingly, it would be evident that this may be easily improved by reducing the contact area between the two mechanical parts of the device such as through provisioning of electrodes with increased thickness in the vicinity of the QPC only, smaller flip-chip elements etc.

Figure 6:
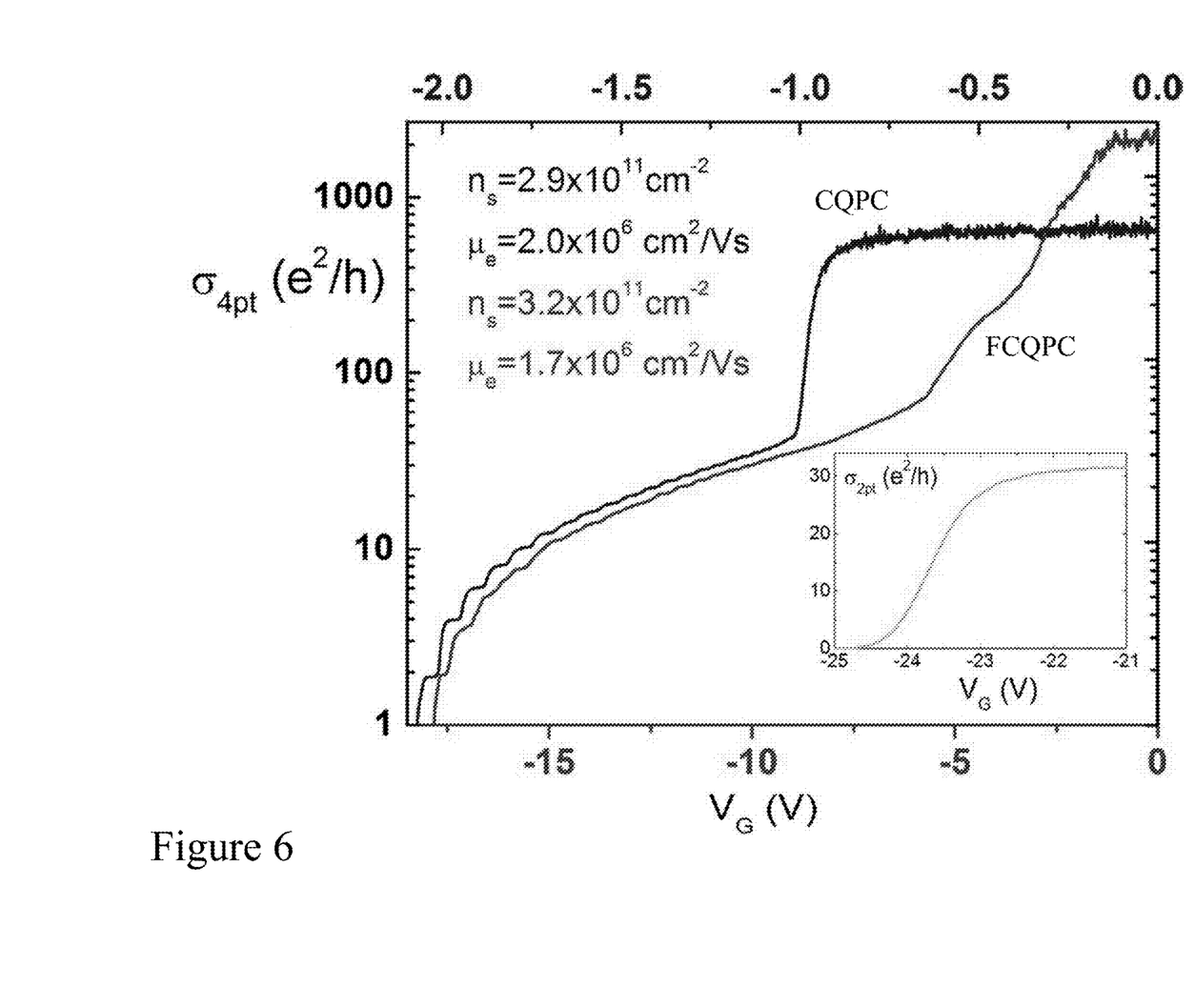
FIG. 6 depicts the conductivity across a WDEG as a function of gate voltage applied to a convention QPC and a flip-chip QPC (FCQPC) formed according to an embodiment of the invention.

Referring to FIG. 6 there is depicted a typical example of the conductivity versus pinch-off gate voltage on a logarithmic scale for both a FCQPC and a CQPC. The data were taken at 25 mK using a similar 2DEG GaAs/AlGaAs heterostructure with a moderate mobility of 2×10$^6$ cm$^2$/V·s (although not coming from the exact same wafer). For both devices, the quantization of the conductance is clearly observed. Whilst the CQPC shows better-defined and more precise conductance plateaus (ballistic behaviour), this likely arises from the shape of the QPCs that were not identical, and because of both the air gap present in the FCQPC and shallowness of the 2DEG modifying the gate-induced electric field profile.

The inventors also note that in the metallic regime at conductance below ~50 e$^2$/h, the slopes of the FCQPC and CQPC are strikingly similar. Further, the inventors have not observed a pronounced hysteresis in the pinch-off curve of the FCQPC devices whereas this undesirable behaviour is often observed in conventional CQPC gated devices. Also depicted in FIG. 2 in the inset is a plot of the conductance of a FCQPC integrated with an ultra-high mobility (µ~1.0× 10$^7$ cm$^2$/V·s) GaAs/AlGaAs 2DEG and measured at 4K is shown. Albeit with a lower gate efficiency, this data demonstrates that the flip-chip process can be integrated with the highest mobility 2DEG materials.

Figure 7:
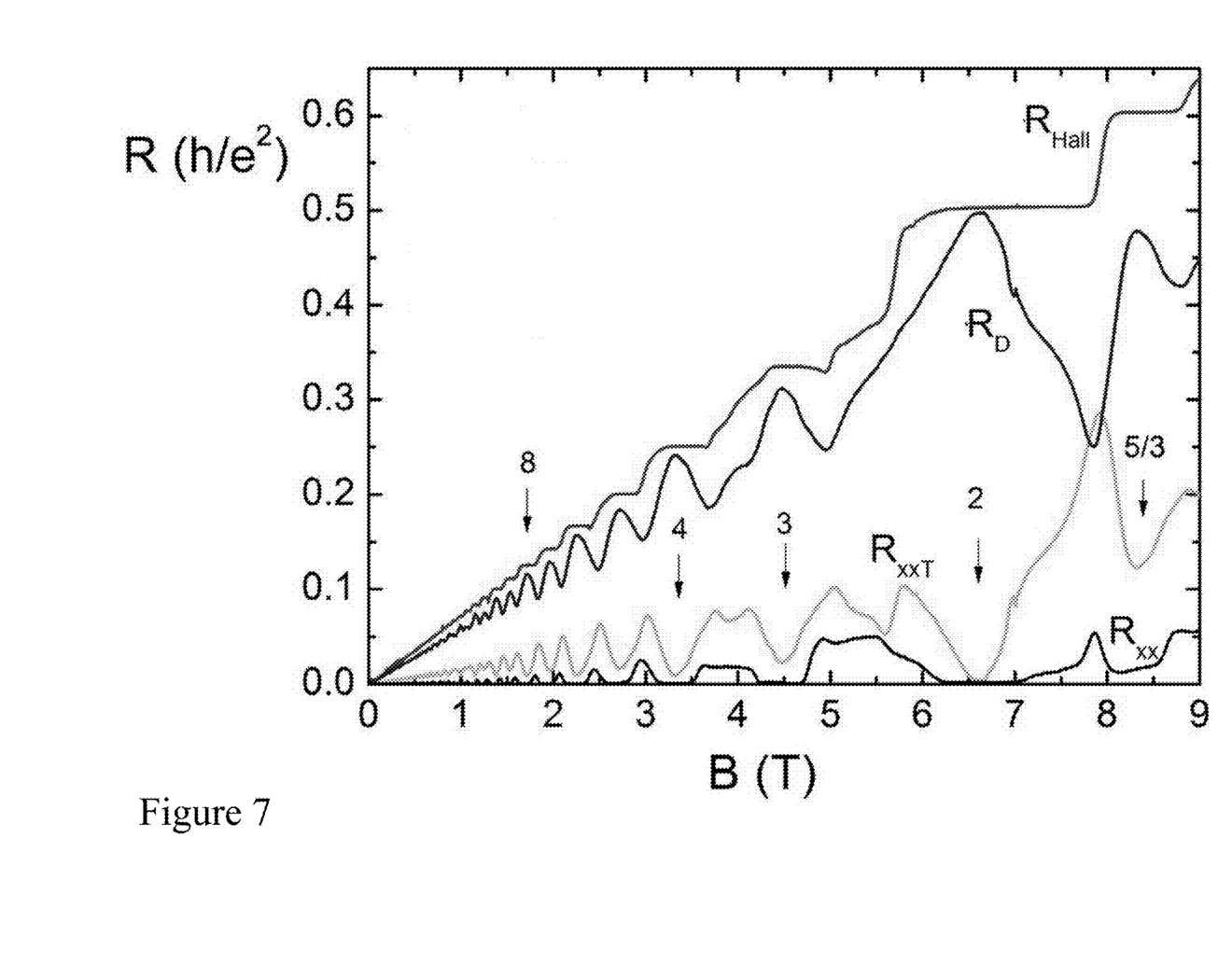
FIG. 7 depicts the Hall resistance ($R_H$), longitudinal resistance outside ($R_{xx}$) and through ($R_{xxT}$) a FCQPC formed according to an embodiment of the invention as well as diagonal resistance ($R_D$, a mixing of $R_H$ and $R_{xxT}$) versus the magnetic field measured on sample A wherein clear quantum Hall effect (QHE) and fractional-QHE (FQHE) can be observed.

Quantum Hall Regime:

FCQPC devices were then characterized in the quantum Hall regime at very low temperatures in a magnetic field up to 9 T. Referring to FIG. 7 there is depicted the measured resistance for various configurations within sample A. The Hall resistance, R$_{HALL}$, measured outside of the interferometer shows good quantization of the IQH plateaus and the 5/3 FQH plateau, as expected for a sample in this range of mobility. Due to the geometry of our design, it is not possible to directly measure R$_{HALL}$ under the interferometer. Accordingly, the inventors measured the diagonal resistance R$_D$, which includes a large longitudinal contribution. Also shown are R$_{xx}$ outside of the interferometer and R$_{xxT}$ through the interferometer. Again, the device geometry plays a role, since the contacts outside are much closer together and the measured voltage is correspondingly smaller. The fact that R$_{xxT}$ does not reach zero in all of the states and that R$_{xx}$ does may be due to the flip-chip blocking light from the LED used during the cooling process or to the non-ohm nature of particular contacts. The inventors note that in the quantum Hall regime the conductivity is related to the resistivity by the tensor relations given in Equations (1A) and (1B). As a result, it is difficult to extract them in these experiments as they require the measurement of both R$_{HALL}$ and R$_{xx}$ all regions of the sample in a well-controlled geometry, which is not the case within the prototype devices employed in demonstrating embodiments of the invention.

$$\sigma_{xx} = \frac{\rho_{xx}}{(\rho_{Hall}^2 + \rho_{xx}^2)} \quad (1A)$$

$$\sigma_{Hall} = \frac{\rho_{Hall}}{(\rho_{Hall}^2 + \rho_{xx}^2)} \quad (1B)$$

Figure 8:
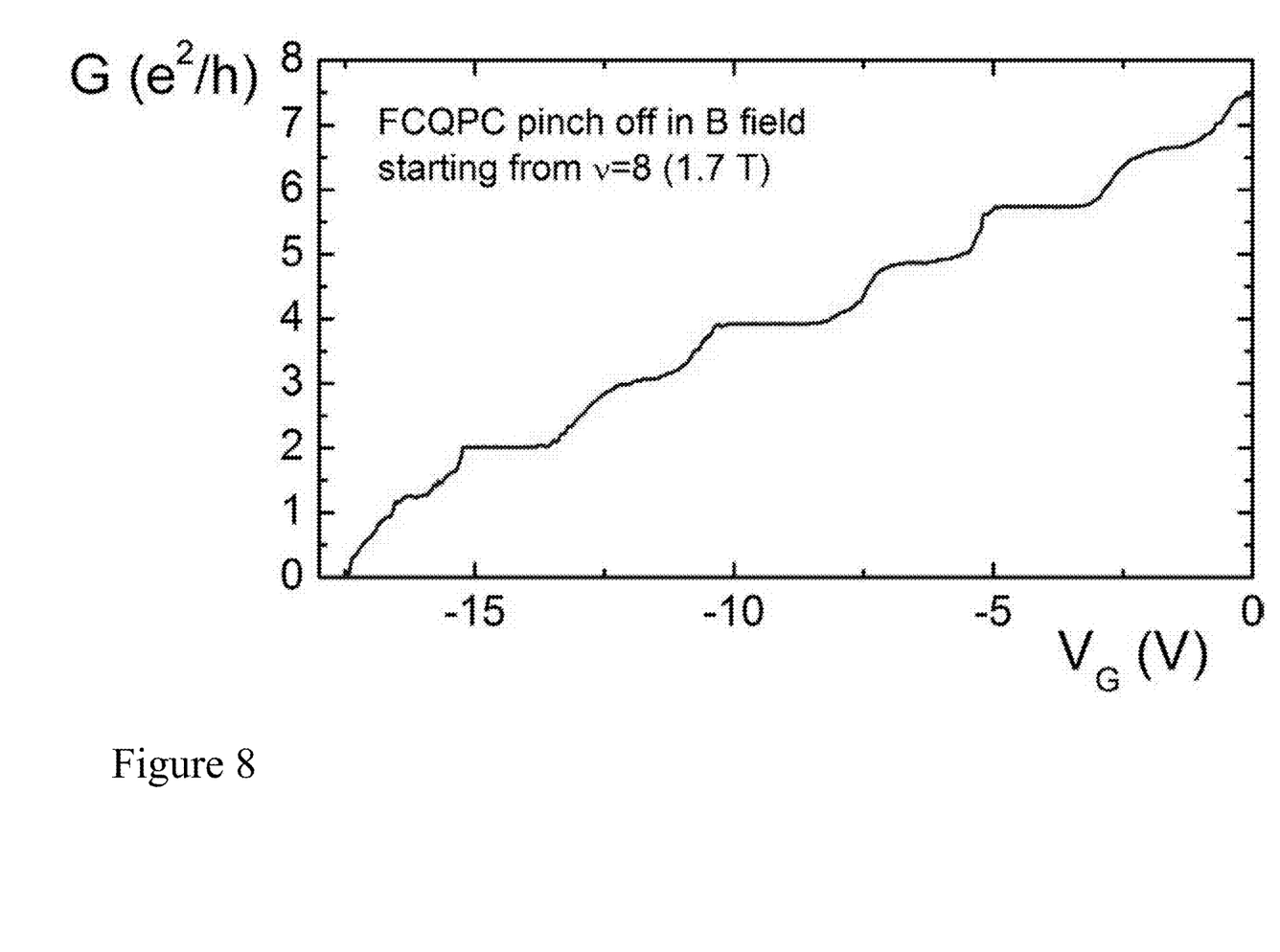
FIG. 8 depicts the diagonal conductance across a QPC formed according to an embodiment of the invention at 1.7 T magnetic field versus gate voltage.

In FIG. 8, the conductance is shown as a function of gate voltage at a magnetic field of 1.7 T, near filling factor v=8. Plateaus occur for each integer multiple of e$^2$/h, with the exception of the first plateau. The quantization for the lowest conductance plateaus (2, 3, 4) is excellent, but degrades for higher plateaus as the contribution of the longitudinal resistance in series with the QPC becomes significant. However, it is evident from the results presented within FIGS. 7 and 8 that FCQPC devices according to embodiments of the invention can operate within a magnetic field at cryogenic temperature with mechanical integrity and stability up to 9 T at 20 mK.

Figure 9:
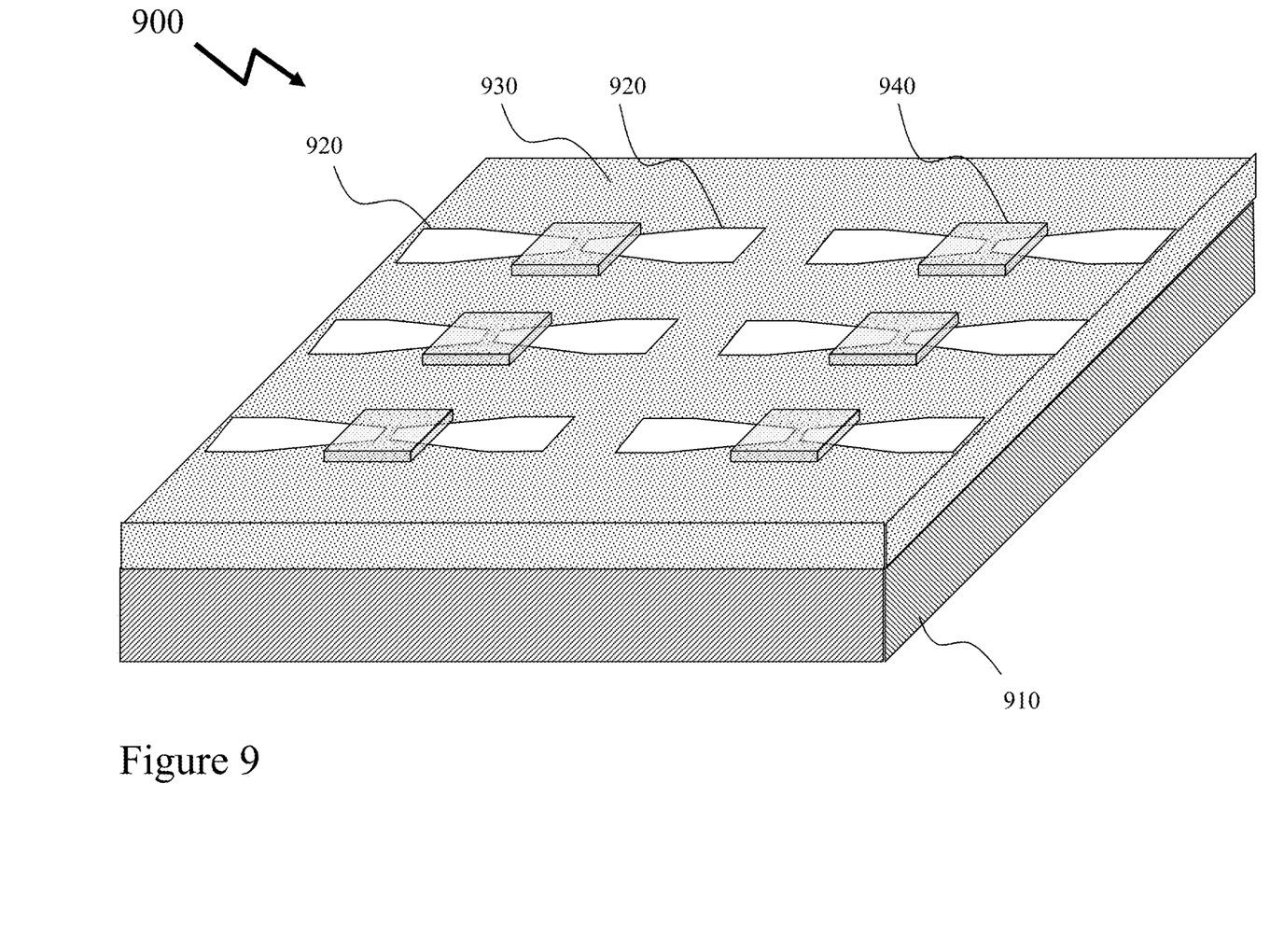
FIG. 9 depicts an exemplary arrayed electronic device of 2DEG "islands" upon an electronic circuit according to an embodiment of the invention.

Now referring to FIG. 9 there is depicted a variation of the device implementation methodology described above in respect of FIGS. 2 through 8 wherein a substrate 910 has patterned atop it a plurality of QPC electrode structures 920 in a metallization layer which have then been planarized with 930. Atop each QPC electrode structure 920 are discrete 2DEG die 940 although it would be evident that a single 2DEG die may be employed to cover the plurality of structures. Depending upon device performance requirements the plurality of QPC electrode structures 920 these may be routed to a common area on the silicon substrate 910 to minimize the footprint of the 2DEG die 940 required.

It would also be evident to one skilled in the art that the plurality of QPC structures 920 may in fact be multiple device structures performing multiple functions in conjunction with a single 2DEG semiconductor structure. It would also be evident that such a methodology as depicted in FIG. 9 including those variations evident to one skilled in the art would also allow for multiple device structures performing multiple functions to be exploited in conjunction with two or more 2DEG semiconductor structures or multiple device structures performing a common function to be exploited with two or more 2DEG structures.

Figure 10:
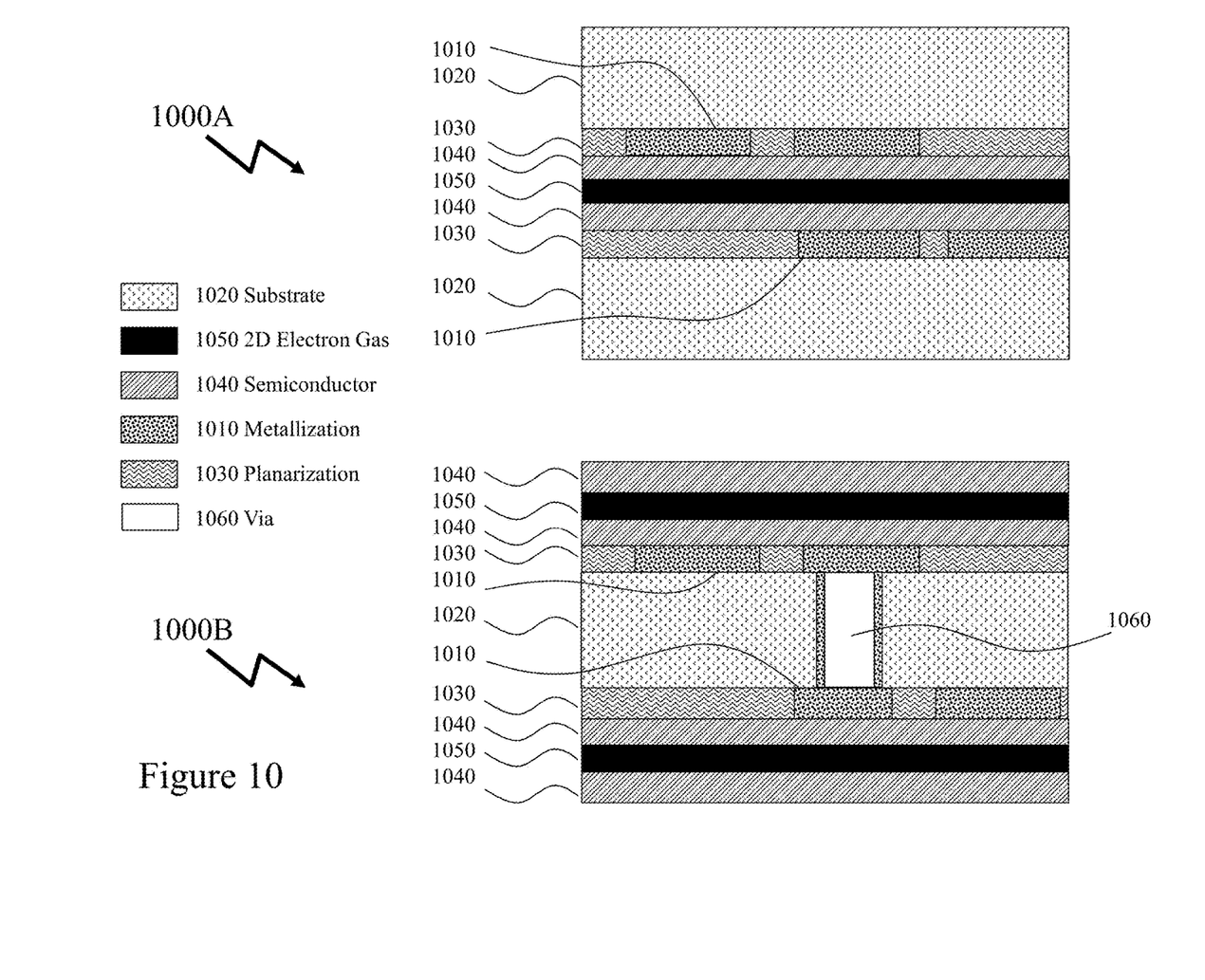
FIG. 10 depicts exemplary 3D stacked electronic circuits exploiting 2DEG structures according to embodiments of the invention.

Further as depicted within FIG. 10 it would be evident that the methodology may be extended to include three dimensional (3D) stacked circuits. Depicted in FIG. 10 are first and second 3D Stacked 2DEG circuits (3DS2DEG) 1000A and 1000B respectively according to the prior art. Considering initially first 3DS2DEG 1000A then a 2DEG structure comprising 2DEG 1020 and semiconductor 1040 was initially assembled onto the lower electronic circuit comprising substrate 1020, metallization 1010, and planarization 1030 thereby forming a first group of 2DEG enabled circuits. Subsequently the upper electronic circuit similarly comprising substrate 1020, metallization 1010, and planarization 1030 was assembled onto the other side of the structure comprising 2DEG 1020 and semiconductor 1040. It is evident from FIG. 1000A that the electrical patterns on the upper and lower electronic circuits may be formed such that the 2DEG enabled circuit is solely contained within one or other of the upper and lower electronic circuits of exploits electrodes and/or circuits within both of the upper and lower electronic circuits. Optionally each of the upper and lower electronic circuits contains active and/or passive electrical circuit elements. Further, the semiconductor 1040 whilst depicted as being the same on the upper and lower surfaces of the 2DEG structure may different and/or multiple semiconductors patterned to provide regions of different semiconductors to different regions of the upper and lower electronic circuits. Such different semiconductors may also be different doping regimens of the same semiconductor or different compositions of the same semiconductor material as evident to one skilled in the art.

Considering now the second 3DS2DEG 1000B then a first 2DEG structure comprising 2DEG 1020 and semiconductor 1040 was initially assembled onto the lower surface of an electronic circuit comprising substrate 1020, metallization 1010, and planarization 1030 thereby forming a first group of 2DEG enabled circuits. Subsequently a second 2DEG structure similarly comprising 2DEG 1020 and semiconductor 1040 was assembled to the upper surface of the electronic circuit which had similarly been patterned with metallization 1010, and planarization 1030. Accordingly, it would be evident to one skilled in the art from FIG. 1000B that the electrical patterns on the upper and lower surfaces of the electronic circuit supported 2DEG enabled circuits which are solely contained within either one the upper and lower 2DEG structures or exploit both upper and lower 2DEG structures which are directly connected for example through the use of a via 1060. Optionally the electronic circuit exploits the both 2DEG electronic structures which are integrated as different elements interconnected via part of the electronic circuit. Optionally each of the upper and lower surfaces of the electronic circuit may contain active and/or passive electrical circuit elements. Further, the semiconductor 1040 whilst depicted as being the same on the upper and lower 2DEG structures may different and/or multiple semiconductors may be patterned to provide regions of different semiconductors to different regions of the upper and lower surfaces of the electronic circuit. Such different semiconductors may also be different doping regimens of the same semiconductor or different compositions of the same semiconductor material as evident to one skilled in the art.

It would be evident to one skilled in the art that the techniques depicted in respect of first and second 3DS2DEG structures 1000A and 1000B may be combined with one another to extend the 3D nature of the implement electronic circuit and/or electronic circuits. It would also be evident that the electronic circuits may be implemented for example using silicon, GaAs, silicon germanium (SiGe) and indium phosphide (InP) material systems whilst the 2DEG structures may exploit GaAs, SiGe, InP, graphene, superconducting oxides, and organic materials for example. Accordingly, a wide variety of circuits and circuit functions may be implemented including, but not limited to, electronic processors, microwave amplifiers, radiation detectors, radiation emitters, optical detectors, optical emitters, receivers, transmitters, analog-to-digital converters, mixers, oscillators, and digital-to-analog converters.

Within the descriptions supra in respect of embodiments of the invention in FIG. 2 through 6 whilst the descriptions have discussed a single semiconductor structure for providing the 2DEG structures it would be evident that as discussed above in respect of FIG. 10 this 2DEG structure interfaced to the electronic circuit may contain different and/or multiple semiconductors which may also be patterned to provide regions of different semiconductors to different regions of the electronic circuit whilst exploiting a single 2DEG die. Such different semiconductors may also be different doping regimens of the same semiconductor or different compositions of the same semiconductor material as evident to one skilled in the art.

Within the above description planarization of the electronic circuit has been described for several configurations and embodiments; however, it would be evident that in other instances no planarization of the electronic circuit may be employed. Further within the above description the semiconductor comprising the EG layer or structures has been essentially considered to be an as manufactured wafer in order to minimize processing applied to it. However it would be evident to one skilled in the art that the EG structure rather than having the electronic circuit brought down onto the surface with the EG layer may itself be brought down into contact with the electronic circuit and a predetermined portion of the EG structure removed such as through the etching of a preferential etching layer (also known as a sacrificial layer) within the stack of manufactured semiconductors, for example, such that after placement this sacrificial layer is etched resulting in a thin EG structure being disposed upon the electronic circuit. Similarly, the reverse may be applied wherein a sacrificial layer is employed within the electronic circuit such that when etched the result is a thin electronic circuit atop the EG structure. Alternatively, other techniques such as epitaxial lift-off may be employed to provide an initially thin structure which is assembled with the other structure.

Further, as discussed supra in respect of embodiments of the invention the 2DEG structures may be replaced with structures exploiting 1D electron gas or "zero" D electron gas configurations. Alternatively, according to the fabrication process for the semiconductor 2D, 1D, and "zero" D electron gas configurations may be implemented within the same semiconductor and/or be different semiconductors within the electron gas wafer through one or more techniques including, but not limited to, doping, composition, and deliberately induced defects.

Whilst the descriptions supra in respect of embodiments of the invention have been discussed with respect to a 2DEG structure formed within a planar structure of semiconductor materials it would be evident that the technique can be applied to other 2DEG, 1DEG, and "zero" DEG structures including but not limited to 2DEG heterostructures, nanowires, carbon nanotubes, nanotubes, graphene, and quantum dots.

It would also be evident that whilst the discussions supra have included reference to CMOS, MOSFET, and HEMT electronics that other electronic circuits including for example those exploiting HBTs, FETs, HFETs, and MODFETs. It would be further evident that the electronic circuits may themselves also include 2DEG, 1DEG, and "zero" DEG portions formed within the semiconductor material in addition to exploiting 2DEG, 1DEG, and "zero" DEG elements in one or more different material systems and/or semiconductor materials. Further, whilst the experimental data within FIG. 5 presents electrical characteristics as a function of a DC applied voltage it would be evident to one skilled in the art that the applied electrical signal may be also be an AC field or a DC+AC field combination wherein the AC signals may include radio frequency (RF) and microwave signals.

Whilst the descriptions supra in respect of embodiments of the invention have been described with respect to semiconductor substrates it would also be evident that other materials may be employed to access the EG structures including passive substrates such as ceramics and plastics as well as electrodes and substrates supporting superconductivity. Further within the descriptions supra with respect to embodiments of the invention reference has been made to 2DEG, 1DEG, and "zero" DEG elements and/or structures. However, the methodologies and approaches described may also be applicable to fractional dimension EG elements and/or structures.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method comprising:
providing a first substrate comprising at least metallization of a predetermined configuration on a first surface of the first substrate;
providing a second substrate comprising a semiconductor structure deposited upon a carrier comprising a plurality of vertically stacked semiconductor layers, wherein a predetermined portion of the semiconductor structure supports an electron gas under application of a predetermined electric field to the predetermined portion of the semiconductor structure; and
then, bringing the first substrate and second substrate together such that the at least metallization of the predetermined configuration of the first surface of the first substrate and the semiconductor structure of the second substrate are in physical contact.

2. The method according to claim 1 further comprising, applying predetermined electrical signals to the metallization on the first surface of the first substrate results in the establishment of the predetermined electric field to the predetermined portion of the semiconductor structure thereby generating the electron gas within the predetermined portion of the semiconductor structure.

3. The method according to claim 1 wherein, connecting the first substrate and second substrate together results in an electronic circuit with high mobility electron transport.

4. The method according to claim 1 wherein, the first substrate is selected from the group consisting of silicon, gallium arsenide, silicon germanium, indium phosphide, sapphire, aluminum oxide, aluminum nitride, and mica.

5. The method according to claim 1 wherein, the semiconductor structure is based upon a material system selected from the group comprising silicon, gallium arsenide, silicon germanium, indium phosphide, indium gallium arsenide, and indium gallium arsenide phosphide.

6. The method according to claim 1 wherein, the first substrate comprises a first predetermined portion of an electronic circuit and a functionality of a second predetermined portion of the electronic circuit completing the electronic circuit provided by the second substrate, wherein characteristics of the second predetermined portion of the second substrate supporting the electron gas are determined by an application of electrical signals generated by the first predetermined portion of the electronic circuit coupled to the metallization on the first substrate and creating the predetermined electric field.

7. The method of claim 1 wherein said bringing includes flip-chip bonding the first substrate and the second substrate to one another.

* * * * *